(12) United States Patent
Getman

(10) Patent No.: US 11,818,956 B2
(45) Date of Patent: Nov. 14, 2023

(54) PIEZOELECTRIC ADAPTIVE MESH

(71) Applicant: Anya L. Getman, Sandy, OR (US)

(72) Inventor: Anya L. Getman, Sandy, OR (US)

(*) Notice: Subject to any disclaimer, the term of this patent is extended or adjusted under 35 U.S.C. 154(b) by 718 days.

(21) Appl. No.: 16/837,071

(22) Filed: Apr. 1, 2020

(65) Prior Publication Data
US 2020/0313066 A1 Oct. 1, 2020

Related U.S. Application Data

(63) Continuation-in-part of application No. 16/836,704, filed on Mar. 31, 2020.

(60) Provisional application No. 62/827,193, filed on Apr. 1, 2019, provisional application No. 62/827,195, filed on Apr. 1, 2019, provisional application No. 62/827,215, filed on Apr. 1, 2019.

(51) Int. Cl.
| | |
|---|---|
| *A61H 23/00* | (2006.01) |
| *H10N 30/00* | (2023.01) |
| *A47C 7/74* | (2006.01) |
| *A47C 3/025* | (2006.01) |
| *A61H 23/02* | (2006.01) |

(52) U.S. Cl.
CPC ....... *H10N 30/1061* (2023.02); *A47C 3/0251* (2018.08); *A47C 7/748* (2013.01); *A61H 23/02* (2013.01); *H10N 30/1071* (2023.02); *A61H 2201/0138* (2013.01); *A61H 2201/5064* (2013.01)

(58) Field of Classification Search
CPC .............. H01L 41/082; H01L 41/0825; A61H 23/0245; A61H 2201/0138; A61H 23/02; A47C 7/748; A47C 3/0251; H10N 30/1061; H10N 30/00; H10N 30/1071
See application file for complete search history.

(56) References Cited

U.S. PATENT DOCUMENTS

| | | | |
|---|---|---|---|
| 6,392,332 B1 | 5/2002 | Sung | |
| 6,601,054 B1 * | 7/2003 | Lo | G05B 17/02 706/14 |
| 7,550,896 B1 * | 6/2009 | Su | H10N 30/00 310/316.02 |
| 9,636,431 B2 | 5/2017 | Teeling et al. | |
| 10,013,058 B2 * | 7/2018 | Puskarich | H01L 41/0986 |

(Continued)

FOREIGN PATENT DOCUMENTS

| | | | | |
|---|---|---|---|---|
| KR | 20130092911 A | * | 8/2013 | ............. A47C 7/748 |
| WO | WO-2016175321 A1 | * | 11/2016 | ........... D03D 1/0088 |

OTHER PUBLICATIONS

In Seok Kang, Nonutility Generation Heating Seat Chair Using Piezoelectric Harvesting 2013, KR 20130092911 (Year: 2013).*

(Continued)

*Primary Examiner* — Margaret M Luarca
*Assistant Examiner* — Tyler A Raubenstraw
(74) *Attorney, Agent, or Firm* — Enterprise Patent LLC

(57) ABSTRACT

A piezoelectric adaptive mesh includes multiple piezoelectric fibers that include piezoelectric structures that can act as sensor and/or actuators to enhance a person's comfort. The piezoelectric structures communicate with a controller and/or a software processing system and may identify the position of a user and make adjustments through the actuators to increase user comfort by providing support, assistance, treatment, and/or temperature adjustment.

26 Claims, 3 Drawing Sheets

(56) References Cited

U.S. PATENT DOCUMENTS

| | | | |
|---|---|---|---|
| 10,347,815 B1* | 7/2019 | Sleator | H01L 41/082 |
| 10,762,751 B2* | 9/2020 | Kessler | G06F 1/163 |
| 2006/0122544 A1* | 6/2006 | Ciluffo | A61B 5/015 |
| | | | 601/79 |
| 2013/0075484 A1 | 3/2013 | Rhee et al. | |
| 2017/0029985 A1* | 2/2017 | Tajitsu | H01L 41/113 |
| 2018/0142951 A1 | 5/2018 | Momem et al. | |
| 2018/0258561 A1* | 9/2018 | Khoshkava | G06F 3/016 |
| 2019/0252596 A1* | 8/2019 | Akimoto | H10N 30/60 |

OTHER PUBLICATIONS

Machine translation of written description and claims for WO2016175321 (Year: 2016).*

NPL-30: "A new drone can change its shape to fly through a narrow gap" retrieved Sep. 21, 2021 from https://robohub.org/a-new-drone-can-change-its-shape-to-fly-through-a-narrow-gap/, pp. 5.

MPL-31: "A tether-less legged piezoelectric miniature robot for bidirectional motion" retrieved Sep. 21, 2021 from https://www.youtube.com/watch?v=i4hORCb2sfs, pp. 3.

NPL-32: "Detection of Mobile Machine Damage Using Accelerometer Data and Prognostic Health Monitoring Techniques," Getman et al., (2009), Paper #15026 in Computational Intelligence in Vehicles and Vehicular Systems, IEEE Workshop on CIVVS/SSCI '09, retrieved Sep. 21, 2021 from https://ieeexplore.ieee.org/document/4938730, pp. 2.

NPL-33: "DGPA/INS integration using neural network methodology" retrieved Sep. 20, 2021 from "DGPS/INS integration using neural network methodology," Ibrahim, et al., ICTAI 2000: 114-121 [—] 1990-1999, pp. 8.

NPL-34: "DroneMobile" retrieved Sep. 18, 2021 from https://www.dronemobile.com, pp. 4.

NPL-35: "Energy Harvesting 'Piezo-tree' Concept" retrieved Sep. 18, 2021 from https://www.alternative-energy-news.info/energy-harvesting-piezo-tree-concept/, pp. 9.

NPL-36: "Expert System" retrieved Sep. 20, 2021 from https://en.wikipedia.org/wiki/Expert_system, pp. 12.

NPL-37: "Generating Ultrasound with Piezo Components" retrieved Sep. 21, 2021 from https://www.piceramic.com/en/piezo-technology/generating-ultrasound-with-piezo-components/, pp. 7.

NPL-38: "Giant Superelastic Piezoelectricity in Flexible Ferroelectric BaTiO3 Membranes" retrieved Sep. 21, 2021 from https://arxiv.org/ftp/arxiv/papers/2002/2002.08166.pdf, pp. 24.

NPL-39: "High-Speed Deformable Mirror for Laser Beam Focus Control in Cutting & Welding Applications" retrieved Sep. 21, 2021 from https://www.pi-usa.us/en/tech-blog/laser-beam-focus-control-in-cutting-welding-applications-with-high-speed-deformable-mirror/, pp. 7.

NPL-40: "How does the Piezoelectric Effect Work for Motion" retrieved Sep. 21, 2021 from https://www.youtube.com/watch?v=fHp95e-CwWQ, pp. 3.

NPL-41: "Inference Engine" retrieved Sep. 20, 2021 from https://en.wikipedia.org/wiki/Inference_engine, pp. 3.

NPL-42: "Lego Mindstorms NXT Robot controlled by Android Bluetooth" retrieved Sep. 18, 2021 from https://www.bing.com/videos/search?q=cell+phone+navigate+lego+robot+ap&view=detail&mid=7E15053A83A4839063FE7E15053A83A4839063FE&FORM=VIRE, pp. 3.

NPL-43: "NASA Is Working on Origami Solar Arrays That Unfurl in Space" retrieved Sep. 21, 2021 from https://gizmodo.com/nasa-is-working-on-origami-solar-arrays-that-unfurl-in-1622328583, pp. 5.

NPL-44: "Piezo-actuated mouse intracytoplasmic sperm injection" retrieved Sep. 21, 2021 from https://www.ncbi.nlm.nih.gov/pubmed/17406589, p. 9.

NPL-45: "Piezo Buzzers" retrieved Sep. 21, 2021 from https://www.americanpiezo.com/standard-products/buzzers.html, pp. 4.

NPL-46: "Piezoelectric driver finds buzzer's resonant frequency" retrieved Sep. 21, 2021 from https://www.edn.com/piezoelectric-driver-finds-buzzers-resonant-frequency/, pp. 6.

NPL-47: "Piezoelectric Materials in RF Applications" retrieved Sep. 21, 2021 from https://www.intechopen.com/books/piezoelectric-materials/piezoelectric-materials-in-rf-applications, pp. 34.

NPL-48: "Polymer Nanocomposites" retrieved Sep. 21, 2021 from https://www.mri.psu.edu/mri/research-capabilities/traditional-research/polymeric-systems/polymer-nanocomposites, pp. 2.

NPL-49: "Resonance-Driven Passive FoldingUnfolding Flapping Wing Actuator" retrieved Sep. 21, 2021 from https://vww.mdpi.com/2076-3417/10/11/3771/htm, pp. 13.

NPL-50: "Resonance mode and sound pressure produced by circular diaphragms of electrostatic and piezoelectric speakers" retrieved Sep. 21, 2021 from https://www.sciencedirect.com/science/article/abs/pii/S0003682X17302712, pp. 2.

"NPL-51: Robotic Piece picking gets more flexible with AI-enabled adaptive tooling" retrieved Sep. 21, 2021 from https://www.therobotreport.com/robotic-piece-picking-more-flexible-ai-enabled-adaptive-tooling/, pp. 15.

NPL-52: "The usefulness of a piezo-micromanipulator in intracytoplasmic sperm injection in humans" retrieved Sep. 21, 2021 from https://www.ncbi.nlm.nih.gov/pubmed/10099992, pp. 6.

NPL-53: "This wind turbine generates power without blades" retrieved Sep. 18, 2021 from https://qz.com/406984/this-wind-turbine-generates-power-without-blades/, pp. 2.

NPL-54: "University Scientists Unveil Device That Uses Proteins to Generate Electricity 'Out of Thin Air'" retrieved Sep. 18, 2021 from https://www.goodnewsnetwork.org/device-uses-protein-to-generate-electricity-from-thin-air/, pp. 5.

"NPL-55: Velodyne Powers New NavVis VLX Mapping System" retrieved Sep. 18, 2021 from https://velodynelidar.com/press-release/velodyne-lidar-puck-lite-navvis-vlx-mapping-system/, pp. 15.

NPL-56: "Notification of Transmittal or Search Report and Written Opinion of the ISA, or the Declaration" published on Aug. 12, 2021 in Internation Search Report for PCT/US2021/021588, pp. 17.

NPL57: "Robot Trajectory Control Employing A Novel Neural Architecture," Getman, Anna L., Engineering Master's Thesis: Rensselaer Polytechnic Institute, Troy, NY, Dec. 1992.

"These clothes can wirelessly charge your phone", Parija, (Jun. 28, 2016), retrieved Sep. 30, 2021 from https://money.cnn.com/2016/06/28/technology/baubax-wireless-charging-clothing-kickstarter/, pp. 5.

"Wireless Charging Apparel", (Aug. 10, 2016), retrieved Sep. 30, 2021 from https://www.kickstarter.com/projects/baubax/worlds-smartest-wireless-charging-apparel-baubax?token=4b43c783, pp. 2.

"This travel jacket does 15 things at once", Parija, (Aug. 27, 2015), retrieved Sep. 30, 2021 from https//money.cnn.com/2015/07/07/smallbusiness/baubax-travel-jacket-15-features/?iid=EL, pp. 6.

"Phone-charging boots", Leslie, (Jun. 18, 2010), retrieved Sep. 30, 2021 from https://www.cnet.com/news/phone-charging-boots-walk-a-lot-to-talk/, pp. 3.

"The World's First Phone-Charging Pants Are Here", Daniel, (2014), retrieved Sep. 30, 2021 from https://wwwbusinessinsider.com/fashion-designer-adrien-sauvage-and-microsoft-create-first-wireless-phone-charging-pants-2014-6, pp. 8.

"Belmint Back Stretching Electric Mat", retrieved Sep. 30, 2021 from https://www.amazon.com/dp/B07NK7Z46Z, pp. 11.

"Ultrasound Cavitation Machines", retrieved Sep. 30, 2021 from https://www.bestreviews.guide/cavitation-machines, pp. 4.

"DigiKey", retrieved Sep. 30, 2021 from https://www.digikey.com/product-detail/en/te-connectivity-measurement-specialties/1004308-2/223-1872-ND/279650, pp. 4.

"Piezo Cables", retrieved Sep. 30, 2021 from https://www.te.com/usa-en/product-CAT-PFS0001.html, pp. 3.

"Artificial synesthesia via sonification: Awearable augmented sensory system", Foner, (Mar. 1999), retrieved Sep. 30, 2021 from https://link.springer.com/article/10.1023/A:1019178210975, pp. 4.

"Fundamentals of Wearable Computers and Augmented Reality", retrieved Sep. 30, 2021 from https://www.amazon.com/s?k=9781482243512, pp. 2.

(56) References Cited

OTHER PUBLICATIONS

"The wearable robot that helps people walk again", Arjun, retrieved Sep. 30, 2021 from https://www.cnbc.com/2015/04/29/the-bionic-suit-that-helps-paralyzed-people-walk-again.html, pp. 4.
"Piezoelectric Actuators", Carter et al, retrieved Sep. 30, 2021 from https://piezo.com/pages/piezoelectric-actuators, pp. 27.
"PHT Magnetics", retrieved Sep. 30, 2021 from http://phtmagnetics.com/, p. 1.
"Veredus Magnetik Rug", retrieved Sep. 30, 2021 from https://www.smartpakequine.com/pt/veredus-magnetik-rug-10755, p. 1.
"Faraday Blanket With Pocket EMF Protective 40GHz Tested", retrieved Sep. 30, 2021 from https://www.smart-safe.com/products/electromagnetic-radiation-protective-blanket, pp. 5.
"Blackhawk Under the Radar Cell Phone Pouch Black", retrieved Sep. 30, 2021 from https://www.walmart.com/ip/Blackhawk-Under-the-Radar-Cell-Phone-Pouch-Black/39989685, p. 1.
"GoDark Faraday Bags", retrieved Sep. 30, 2021 from https://godarkbags.com/products/godark-faraday-bags-stop-hacking-and-location-tracking-of-your-cell-phone-and-tablet, pp. 11.
"Compex Edge 3.0 Muscle Stimulator With Tens Kit", retrieved Sep. 30, 2021 from https://www.compex.com/compex-edge-2-0-muscle-stimulator-kit-with-tens, pp. 6.
"EMG ECG Foam Solid Gel Electrodes", retrieved Sep. 30, 2021 from https://shop.openbci.com/products/skintact-f301-pediatric-foam-solid-gel-electrodes-30-pack?variant=29467659395, p. 1.
"Octopus Suction Cups", Greg, retrieved Sep. 30, 2021 from https://pixels.com/featured/octopus-suction-cups-greg-ochocki.html, pp. 3.
"TENS Unit Pad Placement", retrieved Sep. 30, 2021 from https://omronhealthcare.com/2014/01/10-tips-for-tens-pad-placement/, pp. 2.
"Pain Management", retrieved Sep. 30, 2021 from https://omronhealthcare.com/tens-units/, pp. 5.
"Pad Placement Guide", retrieved Sep. 30, 2021 from https://ib0k33wyb0z22kedo19bkqd1-wpengine.netdna-ssl.com/wp-content/uploads/PM3030-PAD-GUIDE-08062012.pdf, p. 1.
"Patient Aid Full Body Mesh Patient Lift Sling", retrieved Sep. 30, 2021 from https://www.amazon.com/Patient-Sling-Weight-Capacity-Medium/dp/B0757DZRJB, pp. 7.
"Cabaret Stretch Mesh Fabric", retrieved Sep. 30, 2021 from https://www.fabricwholesaledirect.com/products/cabaret-stretch-mesh-fabric?variant=15499387462, pp. 5.
"Ottertex Solution Dyed Acrylic Waterproof Fabric", retrieved Sep. 30, 2021 from https://www.fabricwholesaledirect.com/products/ottertex-solution-dyed-acrylic-waterproof-fabric, pp. 9.
"Danish Modern Chair Repair Danish Rubber Strap Steel Loop", retrieved Sep. 30, 2021 from https://www.etsy.com/listing/682691165/danish-modern-chair-repair-danish-rubber, pp. 3.
"MIT Engineers Create a Programmable Digital Fiber" https://scitechdaily.com/mit-engineers-create-a-programmable-digital-fiber-with-memory-sensors-and-ai/, pp. 5.
NPL58: "Multifunctional Piezoelectric Energy Harvesting Concepts," Anton, Steven R. (Apr. 25, 2011).

* cited by examiner

PIEZOELECTRIC ADAPTIVE MESH

CROSS REFERENCE TO RELATED APPLICATION

This application is a non-provisional application of U.S. Provisional Application No. 62/827,215, which was filed on Apr. 1, 2019, the contents of which are herein incorporated by reference in their entirety for all purposes; this application is a non-provisional application of U.S. Provisional Application No. 62/827,193, which was filed on Apr. 1, 2019, the contents of which are herein incorporated by reference in their entirety for all purposes; this application is a non-provisional application of U.S. Provisional Application No. 62/827,195, which was filed on Apr. 1, 2019, the contents of which are herein incorporated by reference in their entirety for all purposes; and this application is a continuation-in-part of U.S. patent application Ser. No. 16/836,704, which was filed on Mar. 31, 2020, the contents of which are herein incorporated by reference in their entirety for all purposes.

TECHNICAL FIELD

The field of this disclosure relates generally to piezoelectric material and, in particular, to a piezoelectric adaptive mesh.

BACKGROUND INFORMATION

Piezoelectric materials create electrical charge when mechanically stressed, and they can cause mechanical movement in response to electrical stimulation. Moreover, a piezoelectric material can also be used to measure changes in pressure, acceleration, temperature, strain, or force by converting them to an electrical charge. Piezo-electric actuators may convey a variety of types of movement. Piezoelectric cells can change dimensions when an electric potential is applied. They are commercially available in stacks of thin layers that extend when voltage is applied to them. They can provide a variety of types of motion, including lateral motion or bending motion.

OVERVIEW OF DISCLOSURE

One aspect of this disclosure relates to a piezoelectric adaptive mesh that can act as a sensor or an actuator to enhance a person's comfort.

In one embodiment, an adaptive piezoelectric mesh system comprises: multiple piezoelectric fibers, constituting a piezoelectric mesh, operable to act as sensors and/or actuators; and a controller in communication with the multiple piezoelectric fibers and operable to receive sensor input from the multiple piezoelectric fibers and operable to direct power to the multiple piezoelectric fibers.

In some additional, alternative, or selectively cumulative embodiments, a reactive piece of furniture comprises: an adaptive piezoelectric mesh system having multiple piezoelectric fibers configured as a piezoelectric mesh, including first multiple piezoelectric fibers having first piezoelectric structures operable to function as sensors and second multiple piezoelectric fibers having second piezoelectric structures operable to function as actuators; and a controller responsive to a software processing system that is operable to directly or indirectly receive sensor input from the first piezoelectric structures and operable to cause the controller to direct power to one or more of the second piezoelectric structures in response to the sensor input.

In some additional, alternative, or selectively cumulative embodiments, an adaptive piezoelectric mesh system for furniture comprises: multiple piezoelectric fibers configured as a piezoelectric mesh, including first multiple piezoelectric fibers having first piezoelectric structures operable to function as sensors and second multiple piezoelectric fibers having second piezoelectric structures operable to function as actuators; and a controller responsive to a software processing system that is operable to directly or indirectly receive sensor input from the first piezoelectric structures and operable to cause the controller to direct power to one or more of the second piezoelectric structures in response to the sensor input.

In some additional, alternative, or selectively cumulative embodiments, a method for responding to human movement on a piece of furniture comprises: providing a fabric including piezoelectric structures including sensors and actuators at specific locations in the fabric; employing the sensors to sense human interaction with the fabric; conveying data regarding the human interaction with the fabric at affected ones of the sensors at the specific locations to a software processing system; employing the software processing system to interpret the data regarding the human interaction with the fabric at the affected ones of the sensors at the specific locations; and directing a controller to cause actuators at one or more of the specific locations to respond to an interpretation of the data by the software processing system.

In some additional, alternative, or selectively cumulative embodiments, the controller may operatively communicate with a software processing system.

In some additional, alternative, or selectively cumulative embodiments, the software processing system may include or communicate with trainable artificial intelligence (AI) system.

In some additional, alternative, or selectively cumulative embodiments, the controller may operatively communicate with a trainable AI system.

In some additional, alternative, or selectively cumulative embodiments, the trainable AI system comprises one or more of a neural network, a probabilistic technique such as Bayes or Markov algorithm, a kernel method (like SVM, decision trees/random forest, Gaussians, PCA, can-cor . . . ), reinforcement learning that can have nothing to do with artificial neural networks, artificial reasoning a.k.a. "good old fashioned AI," many path-planning and intelligent control-systems methods that correspond to "classical AI" (not the same as GOFAI), alife (swarms, cellular automata . . . ), agents and chaos systems, and/or any algorithm or group of algorithms that optimize a value function (reinforcement learning and linear dynamic programming).

In some additional, alternative, or selectively cumulative embodiments, the adaptive piezoelectric mesh system is adapted to determine a position of an object, such as a body, interacting with the multiple piezoelectric fibers.

In some additional, alternative, or selectively cumulative embodiments, the adaptive piezoelectric mesh system is adapted to apply a specified amount of force to specific mesh locations in response to weight of a body.

In some additional, alternative, or selectively cumulative embodiments, the adaptive piezoelectric mesh system is implemented as a seat, a bed, a sofa, or any other furniture upon which a person can sit, lie, or recline.

In some additional, alternative, or selectively cumulative embodiments, the adaptive piezoelectric mesh system is implemented as an office chair, a car seat, or a child seat.

In some additional, alternative, or selectively cumulative embodiments, the adaptive piezoelectric mesh system is implemented as a residential bed, a hotel bed, or a hospital bed.

In some additional, alternative, or selectively cumulative embodiments, the adaptive piezoelectric mesh system is implemented as furniture cover, such as a seat cover or a mattress cover.

In some additional, alternative, or selectively cumulative embodiments, the controller operatively communicates to a user interface through a hardwired connection In some additional, alternative, or selectively cumulative embodiments, the controller operatively communicates to a user interface through a wireless connection.

In some additional, alternative, or selectively cumulative embodiments, the user interface includes a smart phone or other electronic device with or without a virtual assistant In some additional, alternative, or selectively cumulative embodiments, the trainable AI system is operable to make constant adjustments to provide increased comfort for a user in real time with or without user input.

In some additional, alternative, or selectively cumulative embodiments, a user can choose settings through the controller and the trainable AI system can readily respond to user movement, and in some cases provide predictive instructions to the piezoelectric mesh.

In some additional, alternative, or selectively cumulative embodiments, the piezoelectric adaptive mesh is operable to slowly rock a person to sleep.

In some additional, alternative, or selectively cumulative embodiments, the piezoelectric adaptive mesh is operable to slowly rock a person a few degrees to one side, then the other, to avoid bedsores.

In some additional, alternative, or selectively cumulative embodiments, the piezoelectric adaptive mesh is operable to provide an adjustable massage mode.

In some additional, alternative, or selectively cumulative embodiments, the piezoelectric adaptive mesh is operable to provide safety enhancements for the elderly or people who are drunk to help with balance, so they don't fall out of bed.

In some additional, alternative, or selectively cumulative embodiments, the piezoelectric adaptive mesh is operable to lean a person toward center as an optional default.

In some additional, alternative, or selectively cumulative embodiments, the piezoelectric adaptive mesh is operable to detect whether a person starts snoring and operable to raise the person's head in response.

In some additional, alternative, or selectively cumulative embodiments, the piezoelectric adaptive mesh is operable to raise the person's head in response to measurements made by an oxygen sensor.

In some additional, alternative, or selectively cumulative embodiments, the piezoelectric adaptive mesh is operable to raise a low spot.

In some additional, alternative, or selectively cumulative embodiments, the piezoelectric adaptive mesh is operable to accommodate sleeping arrangements between two people.

In some additional, alternative, or selectively cumulative embodiments, the piezoelectric adaptive mesh is operable to reduce incidence of limbs going numb during sleep.

In some additional, alternative, or selectively cumulative embodiments, the piezoelectric adaptive mesh is operable to simulate the movement of a waterbed.

In some additional, alternative, or selectively cumulative embodiments, the piezoelectric adaptive mesh is operable to automatically adjust characteristics of a wave to enhance user experience.

In some additional, alternative, or selectively cumulative embodiments, the piezoelectric adaptive mesh is operable to charge up its resonant massage or adjustment modes by capturing human movement and body heat.

In some additional, alternative, or selectively cumulative embodiments, the piezoelectric adaptive mesh is operable to function as a heating pad.

In some additional, alternative, or selectively cumulative embodiments, the piezoelectric adaptive mesh is operable to heat and potentially cool specific locations.

In some additional, alternative, or selectively cumulative embodiments, the piezoelectric adaptive mesh is operable to capture heat from a warmer person in one location and supply heat to a cooler person in another location.

In some additional, alternative, or selectively cumulative embodiments, the piezoelectric adaptive mesh comprises a single layer mesh.

In some additional, alternative, or selectively cumulative embodiments, the piezoelectric adaptive mesh comprises a multiple layer mesh.

In some additional, alternative, or selectively cumulative embodiments, each piezoelectric fiber can act as both a sensor and an actuator.

In some additional, alternative, or selectively cumulative embodiments, the piezoelectric adaptive mesh can be controlled so that the weft acts as sensors and the warp acts as actuators or vice versa.

In some additional, alternative, or selectively cumulative embodiments, the fibers acting as sensors and actuators are equally distributed between weft and warp.

In some additional, alternative, or selectively cumulative embodiments, each mesh layer is operable to act as either a sensor layer or an actuator layer.

In some additional, alternative, or selectively cumulative embodiments, the trainable AI system can modify the location and distribution between sensor and actuator at any time.

In some additional, alternative, or selectively cumulative embodiments, the piezoelectric adaptive mesh includes piezoelectric fibers that form a warp and a weft that are transverse to each other.

In some additional, alternative, or selectively cumulative embodiments, the piezoelectric fibers include multiple discrete, spaced-apart piezoelectric structures.

In some additional, alternative, or selectively cumulative embodiments, the piezoelectric fibers have continuous or partly continuous piezoelectric structures and capabilities.

In some additional, alternative, or selectively cumulative embodiments, the piezoelectric structures are operable to act as sensors and/or actuators.

In some additional, alternative, or selectively cumulative embodiments, all of the piezoelectric structures on a piezoelectric fiber have the same composition.

In some additional, alternative, or selectively cumulative embodiments, the piezoelectric fiber may include two or more piezoelectric structures having different compositions.

In some additional, alternative, or selectively cumulative embodiments, all of the piezoelectric structures on a piezoelectric fiber function as both sensors and actuators.

In some additional, alternative, or selectively cumulative embodiments, some of the piezoelectric structures on a piezoelectric fiber function as dedicated sensors and some of the piezoelectric structures on a piezoelectric fiber function as dedicated actuators.

In some additional, alternative, or selectively cumulative embodiments, the piezoelectric structures are disproportionally distributed between the weft and the warp.

In some additional, alternative, or selectively cumulative embodiments, the sensors and actuators are equally distributed between the weft and warp.

In some additional, alternative, or selectively cumulative embodiments, the sensors and actuators are disproportionally distributed between the weft and warp.

In some additional, alternative, or selectively cumulative embodiments, the piezoelectric fiber may include alternating sensors and actuators as dedicated piezoelectric structures.

In some additional, alternative, or selectively cumulative embodiments, two or more piezoelectric fibers are partnered, such as by being twined together or laid side by side, to form a single line of the weft or the warp.

In some additional, alternative, or selectively cumulative embodiments, partnered piezoelectric fibers are based on different polymers.

In some additional, alternative, or selectively cumulative embodiments, the piezoelectric mesh includes optical fibers.

Selectively cumulative embodiments are embodiments that include any combination of multiple embodiments that are not mutually exclusive.

Additional aspects and advantages will be apparent from the following detailed description of example embodiments, which proceeds with reference to the accompanying drawings.

DETAILED DESCRIPTION OF EMBODIMENTS

Figure 1:
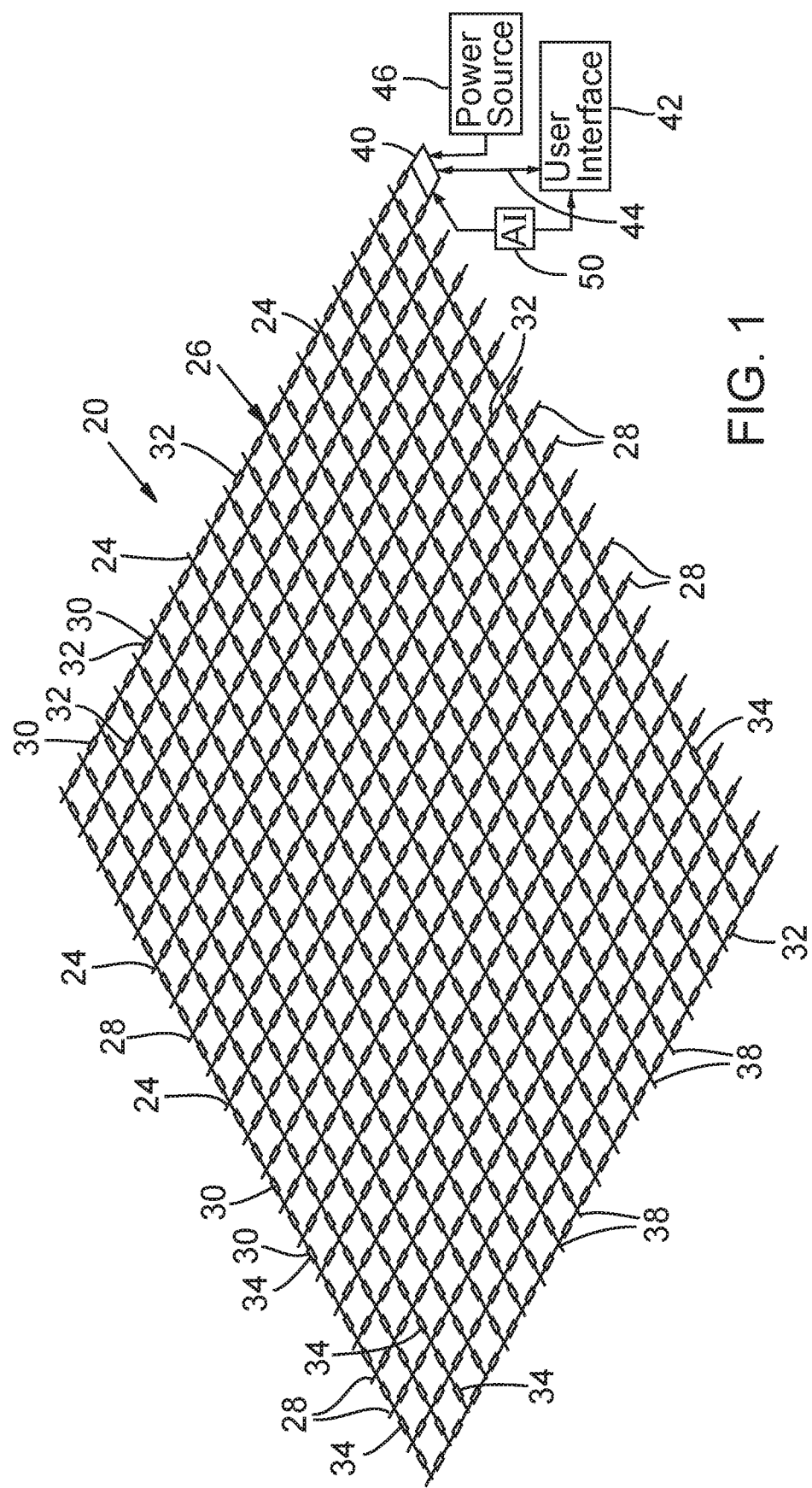
FIG. 1 illustrates a piezoelectric adaptive mesh system.

Example embodiments are described below with reference to the accompanying drawings. Unless otherwise expressly stated in the drawings, the sizes, positions, etc., of components, features, elements, etc., as well as any distances therebetween, are not necessarily to scale, and may be disproportionate and/or exaggerated for clarity.

The terminology used herein is for the purpose of describing particular example embodiments only and is not intended to be limiting. As used herein, the singular forms "a," "an" and "the" are intended to include the plural forms as well, unless the context clearly indicates otherwise. It should be recognized that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise specified, a range of values, when recited, includes both the upper and lower limits of the range, as well as any sub-ranges therebetween. Unless indicated otherwise, terms such as "first," "second," etc., are only used to distinguish one element from another. For example, one element could be termed a "first element" and similarly, another element could be termed a "second element," or vice versa. The section headings used herein are for organizational purposes only and are not to be construed as limiting the subject matter described.

Unless indicated otherwise, the terms "about," "thereabout," "substantially," etc. mean that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

Spatially relative terms, such as "right," left," "below," "beneath," "lower," "above," and "upper," and the like, may be used herein for ease of description to describe one element's or feature's relationship to another element or feature, as illustrated in the drawings. It should be recognized that the spatially relative terms are intended to encompass different orientations in addition to the orientation depicted in the figures. For example, if an object in the figures is turned over, elements described as "below" or "beneath" other elements or features would then be oriented "above" the other elements or features. Thus, the exemplary term "below" can, for example, encompass both an orientation of above and below. An object may be otherwise oriented (e.g., rotated 90 degrees or at other orientations) and the spatially relative descriptors used herein may be interpreted accordingly.

Unless clearly indicated otherwise, all connections and all operative connections may be direct or indirect. Similarly, unless clearly indicated otherwise, all connections and all operative connections may be rigid or non-rigid.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

Many different forms and embodiments are possible without deviating from the spirit and teachings of this disclosure and so this disclosure should not be construed as limited to the example embodiments set forth herein.

Piezoelectric material has been used in shoes to charge electronic devices simply by converting the motion of walking; and textiles woven with piezoelectric wires can generate power when pressed or twisted. See https://www.instructables.com/id/Piezoelectric-Shoes-Charge-Your-Mobile-Device-by-W/and http://theconversation.com/dead-battery-charge-it-with-your-clothes-26097.

Piezoelectric units can provide a variety of types of motion, including lateral motion or bending motion, for example. See https://www.youtube.com/watch?v=fHp95e-CwWQ.

Moreover, a piezoelectric material can also be used to measure changes in pressure, acceleration, temperature, strain, or force by converting them to an electrical charge. Because piezoelectric fibers can generate an electric charge when placed under mechanical stress, a piezoelectric mesh made up of an array of piezoelectric fibers can be used to sense the force. If the locations from where the electrical charges originate are known, then the sensed force can indicate the position of an object, such as a body, interacting with the piezoelectric mesh.

Conversely, an electrical charge can be sent to specific locations within a piezoelectric mesh to apply mechanical force at those locations. By determining the position and force applied by a body, a piezoelectric mesh can provide an adaptive response to the body. For example, an adaptive controller can apply a specified amount of force to specific piezoelectric mesh locations in response to weight of a body. The force can be applied to satisfy a number of criteria including, but not limited to, adjustment, adaptive movement, and massage.

Figure 2:
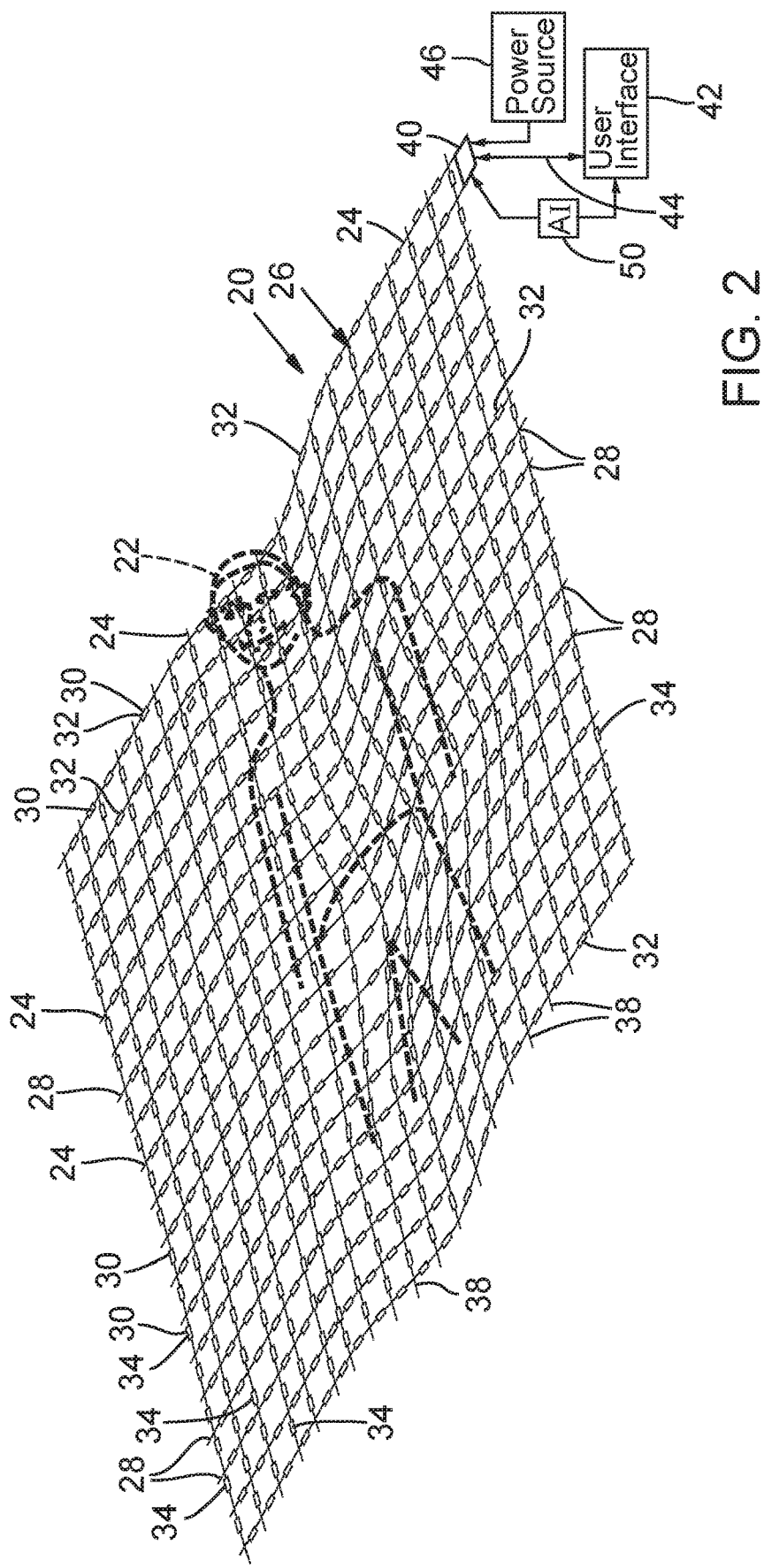
FIG. 2 illustrates a person supported by a piezoelectric adaptive mesh.

FIG. 1 illustrates a piezoelectric adaptive mesh system 20 and FIG. 2 illustrates a person or user 22 supported by a piezoelectric adaptive mesh (also referred to as the piezoelectric mesh) 26. The user 22 is shown in broken lines because in some embodiments the piezoelectric mesh 26 can alternatively be used as a cover or blanket instead of as a supporting surface.

With reference to FIGS. 1 and 2, the piezoelectric adaptive mesh 20 may include multiple piezoelectric fibers 24 that may be configured as a piezoelectric mesh 26. One will appreciate that the spacing in the figures may not be to scale. Depending on the desired sensing resolution, parallel piezoelectric fibers 24 may be positioned to be substantially adjacent to each other or they may be spaced apart. The piezoelectric fibers 24 may be of any suitable diameter and the spacing may be any suitable distance based on desired function. The piezoelectric fibers 24 may range from near nano scale to about 0.3 inches or greater in diameter depending on the construction and the desired function. Thicker piezoelectric fibers 24 may range from about 0.1 inches to about 0.3 inches, medium-sized piezoelectric fibers 24 may range from about 0.03 inches to about 0.1 inches, and smaller piezoelectric fibers 24 may range from about 0.0075 inches to about 0.03 inches. In some embodiments, structural grid members 60, as later described, may be positioned between some or all of the piezoelectric fibers 24.

A piezoelectric fiber 24 may include a long continuous piezoelectric structure 30 such that the entire fiber 24 can sense and/or actuate at any point or node along the fiber 24. A piezoelectric fiber 24 may alternatively or additionally include discrete spaced apart piezoelectric sensors 32 and/or actuators 34 positioned a long a length of wire. A piezoelectric fiber 24 may alternatively or additionally include discrete spaced apart piezoelectric sensors 32 and/or actuators 34 attached to wireless transmitters and receivers.

The piezoelectric fibers 24 may be made from any suitable piezoelectric material. Suitable piezoelectric fibers 24 can be made from grown or wet-extruded from piezoelectric ceramic materials including, but not limited to, $Pb(Z_{r0.52}Ti_{0.48})O_3$ (PZT) nanowires, ZnO nanorods or nanowires, and $BaTiO_3$ (BTO) nanostructures. Some these piezoelectric fibers 24 include discrete, spaced-apart piezoelectric structures 30, such as piezoelectric actuators 32 and piezoelectric sensors 34.

Suitable piezoelectric fibers 24 may be made from melt-spinning or extruding piezoelectric polymers including, but not limited to, poly(vinylidene fluoride) (PVDF), poly(vinylidene fluoride-co-trifluoroethylene) (PVDF-TrFE), and polylactic acid (PLA) fiber- and carbon-fiber-based material (in particular a piezoelectric poly-L-lactic acid (PLLA) and carbon fiber electrode.) These fibers 24 can be easy to produce and may exhibit good piezoelectric performance coupled with good flexibility and chemical resistance. Some of these piezoelectric fibers 24 have a conductive filament core and a piezoelectric polymer layer sheath. Some include an additional conductive layer that may be coated on the fiber as an external electrode. These piezoelectric fibers 24 may provide continuous (or near continuous) piezoelectric capability along the length of the fibers 24.

Suitable piezoelectric polymer fibers 24 may also be made by a thermal drawing technique. For example, a PVDF-TrFE layer can be sandwiched between two carbon-loaded polycarbonate layers and assembled with Tin microfilaments as the electrodes and covered with polycarbonate shell for the protective cladding. Alternatively, a PVDF may be impregnated with piezoelectric ceramics such as BTO and PZT. For more details about these fabrication techniques, see https://www.designnews.com/materials-assembly/flexible-piezo-electric-fabric-turns-kinetic-energy-electricity/173999414358512 and https://www.nature.com/articles/s41598-017-01738-9 and the references cited therein.

Some of the piezoelectric fiber materials may be suitable for use in 3D printers, such as materials used in fused deposition modeling (FDM), digital light processing (DLP), or stereolithography (SLA) printers. Conventional consumer FDM printers can provide a layer thickness of 0.2 or 0.3 mm. Some better desktop models even claim a vertical resolution of 0.02 mm. Readily available SLA printers such can provide layers as thin as 0.025 mm. More advanced SLA printers can offer a 25-micron XY resolution and 25-300 microns (user selectable) in the Z, using an 85-micron laser. The actual accuracy may depend on many factors such as the print performance of a particular material. While 3D printing is an example of another manufacturing method, any other suitable manufacturing method may be employed. Other manufacturing techniques may include injection molding or casting.

Some of larger sized piezoelectric fibers 24 may constitute a piezoelectric spiral-wrapped coaxial cable that utilize a standard core wrapped by a PVDF piezoelectric film tape that is enclosed within a copper braid and covered by a polyethylene outer jacket. The shielding makes these piezoelectric fibers 24 resistant to electromagnetic interference and, particularly, to radio frequency interference. These piezoelectric fibers 24 may perform well as a large-deflection sensing grid and can be effective to three feet or longer (so they can be controlled with two or fewer controllers 40). An example of a piezoelectric spiral-wrapped coaxial cable includes TE™, model # CAT-PSFS00001.

The piezoelectric mesh 26 may include piezoelectric fibers 24 that form a warp 28 and a weft 38 that may be transverse to each other. The piezoelectric fibers 24 may be continuous or discontinuous. Each fiber row may be continuous or include segments. Each fiber column may be continuous or include segments. All of the fiber rows may be formed from one continuous piezoelectric fiber 24, and/or all of the fiber columns may be formed from one continuous piezoelectric fiber 24. The piezoelectric mesh 26 may also be formed as an interconnected grid, either as one large grid or as separate grids that are subsequently connected.

Each piezoelectric fiber 24 may include multiple discrete, spaced-apart piezoelectric structures 30, or the piezoelectric fiber 24 itself may have continuous or partly continuous piezoelectric structures 30 and capabilities. The piezoelectric structures 30 may be operable to act as sensors 32 and/or actuators 34. All of the piezoelectric structures 30 on a piezoelectric fiber 24 may have the same construction or composition, or a piezoelectric fiber 24 may include two or more piezoelectric structures 30 having different constructions or compositions.

All of the piezoelectric structures 30 on a piezoelectric fiber 24 may function as both sensors 32 and actuators 34, or some of the piezoelectric structures 30 on a piezoelectric fiber 24 may function as sensors 32 and some of the piezoelectric structures 30 on a piezoelectric fiber 24 may function as actuators 34. The piezoelectric structures 30 may be equally distributed between the weft 28 and the warp 38, or the piezoelectric structures 30 may be disproportionally distributed between the weft 28 and the warp 38, e.g., the weft 28 may have more piezoelectric structures 30 than the warp 38 or vice versa. Similarly, the sensors 32 and actuators 34 may be equally distributed between the weft 28 and warp 38, or the sensors 32 and actuators 34 may be disproportionally distributed between the weft 28 and the warp 38, e.g., the weft 28 may have more sensors 32 than the warp 38 or vice versa or the weft 28 may have more actuators 34 than the warp 38 or vice versa. In one example of the piezoelectric mesh 26, a piezoelectric fiber 24 may include alternating sensors 32 and actuators 34 as dedicated piezoelectric structures 30. Also, the piezoelectric mesh 26 may include more sensors 32 than actuators 34 or may include more actuators 34 than sensors 32.

Some piezoelectric fibers 24 may include some dedicated piezoelectric structures 30 as sensors 32 or actuators 34 and include some bifunctional piezoelectric structures 30 that are operable as both a sensor 32 and an actuator 34. Alternatively, a piezoelectric fiber 24 may include dedicated piezoelectric structures 30 that act as sensors 32 or include dedicated piezoelectric structures 30 that act as actuators 34. In one example of the piezoelectric adaptive mesh 26, a piezoelectric fiber 24 having ceramic-based piezoelectric structures 30 may include only actuators 34. In another example of the piezoelectric adaptive mesh 26, the warp 28 may include dedicated piezoelectric structures 30 that act as sensors 32 and the weft 38 may include dedicated piezoelectric structures 30 that act as actuators 34.

One will also appreciate that two or more piezoelectric fibers 24 can be twined together (or laid side by side) to form a single line of the weft 28 or the warp 38. These partnered piezoelectric fibers 24 can be of the same or different compositions and functions of piezoelectric structures 30. For example, one of the partnered piezoelectric fibers 24 may include sensors 32 while another includes actuators 34. Alternatively, or additionally, the partnered piezoelectric fibers 24 may be based on different polymers.

The piezoelectric adaptive mesh system 20 can include a single layer piezoelectric mesh 26 or include multiple layers of a piezoelectric mesh 26. These piezoelectric mesh layers may include any of the aforementioned combinations of piezoelectric structures 30, and these piezoelectric mesh layers may be substantially identical or intentionally different. For example, a first layer piezoelectric mesh 26 may be operable to act as sensor layer and second layer of piezoelectric mesh 26 may act as an actuator layer.

Applications that utilize larger and coarser piezoelectric fibers 24 may be used to form a piezoelectric adaptive mesh 26 having a single layer. Applications that benefit from a high-precision (or high-resolution) piezoelectric adaptive mesh 26 having finer and smaller piezoelectric fibers 24 may benefit from a second layer. A piezoelectric adaptive mesh 26 having ultrasonic applications may perform well on a farther side of gel padding 64. In some embodiments, the sensing layers of a piezoelectric adaptive mesh 26 may perform better right next to the user 22. Buzzer-type piezoelectric structures 30 may perform better with a hole 66 in their housing 68 to allow for greater resonance magnitude. The hole 66 may be pointed away from contact with the user in order to actuate and sense better.

Figure 3:
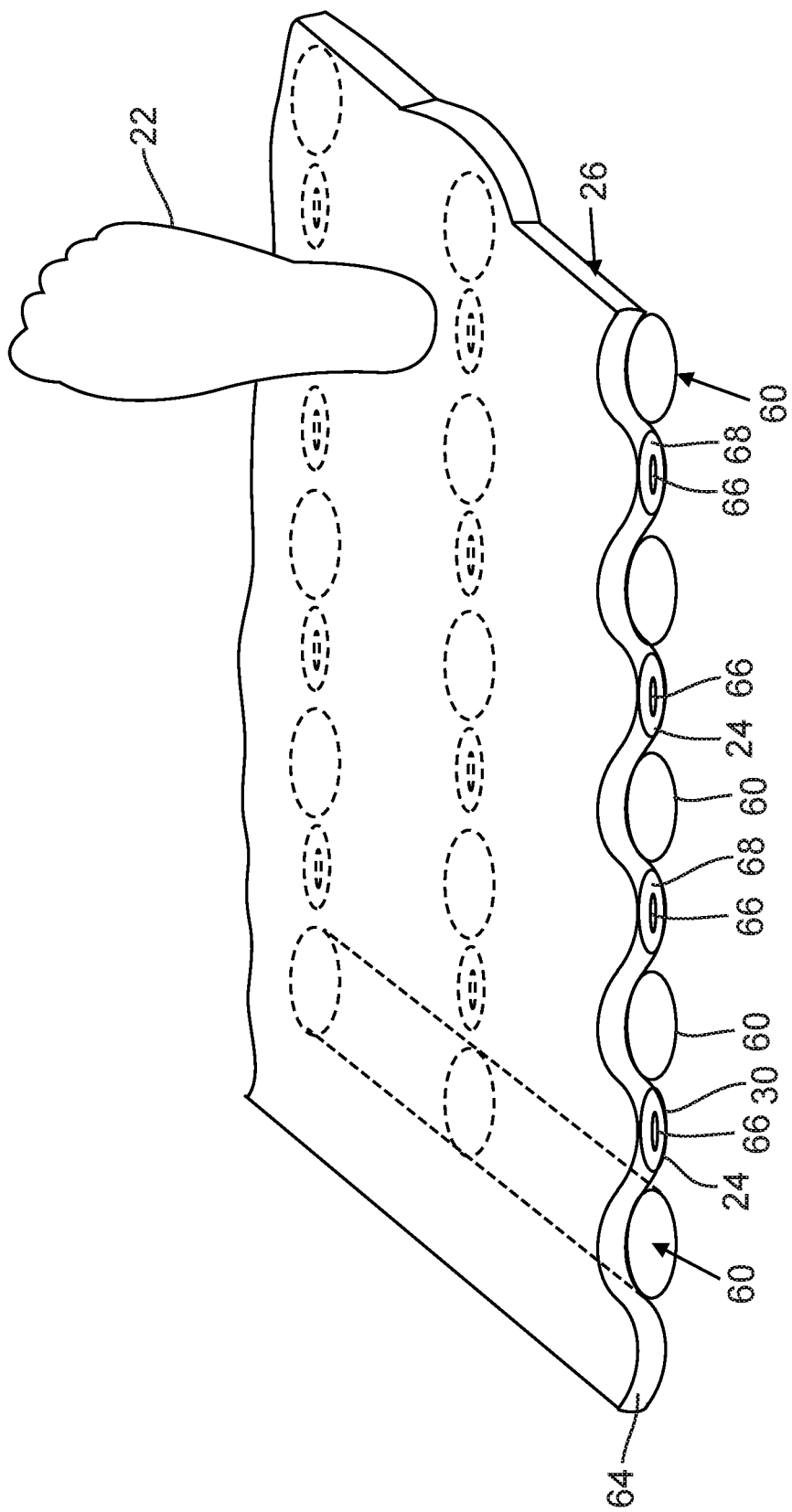
FIG. 3 illustrates an end view of piezoelectric adaptive mesh incorporating structural grid members.

Depending on the size (such as diameter), spacing, and material of the piezoelectric fibers 24 and the piezoelectric structures 30, some of these fibers 24 and structures 30 may not adequately support average human weight all by themselves, or they may be so compressed that they may not be able to reliably send impulses. In some embodiment, the piezoelectric adaptive mesh 26 incorporates spaced apart structural grid members 60. FIG. 3 illustrates an end view of an embodiment of a piezoelectric adaptive mesh 26 incorporating structural grid members 60.

In many embodiments, the structural grid and the structural grid members 60 can vary in construction and design, as long as the entirety of the grid can support the weight of a human standing on any one section with one foot, and the actuators 34 can be attached to it, interlocked through holes in it, and/or run in tunnels through the middle of its cabling/tubing. In one example, the structural grid may contain a woven polyester mesh. A medium-sized woven polyester body mesh may support 600 lbs. See https://www.amazon.com/Patient-Sling-Weight-Capacity-Medium/dp/B0757DZRJB. In another example, the structural grid may contain a 75% polyester, 17% nylon, and 8% spandex fishnet. This embodiment would have holes large enough to fit suction cups or pads through as later described. See https://www.fabricwholesaledirect.com/products/cabaret-stretch-mesh-fabric?variant=15499387462 for an example. In another example, the structural grid may contain a waterproof acrylic canvas. See https://www.fabricwholesaledirect.com/products/ottertex-solution-dyed-acrylic-waterproof-fabric for an example.

In some embodiments, the structural grid members 60 may contain polyurethane elastic fiber seat gel pads, which would be well-suited for ultrasonic applications as later described. See https://beststoreforever.com/products/motorcycle-seat-cushion-gel-pad-polyurethane-elastic-fiber-seat-gel-pads-25×25×1 cm for an example. In other embodiments, the structural grid members 60 may contain hollow rubber coated steel loop support coils. See https://www.etsy.com/listing/682691165/danish-modern-chair-repair-danish-rubber for an example.

In some embodiments, optical fibers may additionally be run inside of the gel padding 64, attached to a fabric/net structural grid, or inside of hollow tubing functioning as a structural grid member 60. A light source of a known wavelength and temperature may be propagated through one end of the fiber, and the light emitted at the other end of the fiber may be read by a sensor to determine the extent of change in that wavelength or temperature. These changes from a baseline may potentially be caused by bending of the optic fiber by the human (or other animal) user 22, and/or may be caused by heat added to, or drawn from, that optic fiber by that user 22. This data may be sensor fused with other data to provide an even more accurate map of the position and state of the user. An infrared light source may combine the tasks of bending and heat transfer. In order to recalibrate a system that has aged and/or stretched inelastically, a sequence of varying wavelengths may be sent down each optic fiber, and results compared to those of an earlier date.

The software processing system, as later described, may utilize the fiber optic data in conjunction with the piezoelectric data to perform a variety of applications. In some examples, the fiber optic bending light feedback, piezoelectric voltage feedback, and/or strain gauges embedded into a structural grid or furniture frame may be compared with other nodes to anticipate the compensation necessary to keep a user 22 upright and/or not fall/tip over from a standing, sitting, or leaning position. These feedback embodiments may apply to instrumented furniture, an instrumented clothing item, or a combination of the two that are cooperating.

Applications that utilize larger and coarser piezoelectric fibers 24 may be used to form a piezoelectric adaptive mesh 26 having a single layer. Applications that benefit from a high-precision (or high-resolution) piezoelectric adaptive mesh 26 having finer and smaller piezoelectric fibers 24 may benefit from a second layer. A piezoelectric adaptive mesh 26 having ultrasonic applications may perform well on a farther side of gel padding 64. In some embodiments, the sensing layers of a piezoelectric adaptive mesh 26 may perform better right next to the user 22. Buzzer-type piezoelectric structures 30 may perform better with a hole 66 in their housing 68 to allow for greater resonance magnitude. The hole 66 may be pointed away from contact with the user in order to actuate and sense better.

The actuators 34, which convert electrical energy to mechanical energy, are available in a variety of shapes, sizes, force-displacement capabilities. Some actuators 34 may provide tremendous force but tiny motion, and some may provide substantial motion but small force. For example, these configurations may provide simple bending, cantilever bending, transverse contraction, longitudinal extension, and shear motion. A tutorial on piezoelectric actuators 34 may be found at https://piezo.com/pages/piezo-electric-actuators.

Accordingly, a piezoelectric fiber 24 may include more than one type of piezoelectric actuator 34. For example, a piezoelectric fiber 24 may include a first type of actuator 34 that is configured to provide substantial pressure and may include a second type of actuator 34 that is configured to provide a vibration. Or, these different types of piezoelectric actuator 34 can be employed on separate or intertwined piezoelectric fibers 24. For example, a piezoelectric spiral-wrapped coaxial cable may be used as a sensor 32 or a pressure actuator 34, while a second type of actuator 34 may be configured to provide a vibration.

The sizes of the actuators 34 may depend on their intended function(s) and the size of the piezoelectric fibers 24 that support them. The actuators 34 may range from near nano scale to about 2 inches, or as long as the piezoelectric fiber 24 in embodiments where the fiber 24 is a continuous actuator 34 along the length of the fiber 24. If not continuous or constituting the actuator as well, the sensors 32 may be smaller than the actuators 34. The actuators 34 of the same type may be spaced apart by about the same distance as the transverse piezoelectric fibers 24, or they may be closer together or farther apart. Spacing (if not continuous) may range from about 0.4 inches to about 5 inches, depending on the intended application(s).

In one embodiment, large, spaced-apart piezoelectric fibers 24 may deflect as much as an inch for each node. So, for a complex shape, there is a lot of flexibility. Edges may be constrained to a frame and structural grid, which may be spaced as far apart as possible to not interfere with the complex shape. For an adaptive piezo electric mesh 26 of 6 feet wide for a bed and the structural members are every 2 feet, a curve could extend down or up as much as a foot in the middle. Smaller piezoelectric fibers 24 spaced more closely together may offer greater deflection capabilities and greater resolution (precision of deflection points).

The adaptive piezo electric mesh 26 may include or be covered with any suitable padding 64 that will increase the comfort of the user 22 while still permitting the piezoelectric structures 30 to achieve their desired functions. A relatively thin layer of memory or other foam type may be employed for the padding 64. In some embodiments, the padding 64 may include a gel such as an ultrasound friendly gel (which may be useful in association with vibrational actuators 34 employed for certain applications as later described.

The piezoelectric adaptive mesh 26 may constitute a separate device and act as independent layer or the piezoelectric adaptive mesh 26 may be built into or onto a piece of furniture as later discussed. Moreover, the piezoelectric adaptive mesh 26 may act independently of other systems, such as being superimposed on an adjustable bed, hospital bed, or a back-stretching mat. Or, the piezoelectric adaptive mesh 26 may be configured to integrate its functions with the functions of the underlying adjustable furniture.

The piezoelectric adaptive mesh system 20 may include or be attached to a controller 40 that may be configured to receive power from a power source 46 and may be configured to direct power from the power source 46 to the piezoelectric fibers 24 in general and, more particularly, to the piezoelectric structures 30 along the fibers 24. The controller 40 may also be configured to receive sensor input (such as electrical pulses) from the piezoelectric structures 30 and cooperate with a software processing system (with or without assistance from an artificial intelligence (AI) system 50) to determine the location of the piezoelectric structures 30 sending the pulses. In embodiments that include piezoelectric structures 30 that can act either as sensors 32 or actuators 34, the AI system 50 can modify the location and distribution between sensors 32 and actuators 34 at any time. One will appreciate that wherever the software processing system is discussed, the AI system 50 may be employed. Similarly, wherever the AI system 50 is discussed, the software processing system may be employed to perform the task without use of the AI system 50.

The controller 40 may operatively communicate with a user interface 42 through a hardwired or wireless connection 44. Examples of a user interface 42 include a hardware user interface that include hardware controls or software interface, such as a graphical user interface on a smart phone or other electronic device (with or without a virtual assistant), or a virtual assistant interface, such as Alexa, Siri, or Google Assistant.

The piezoelectric adaptive mesh 26, the controller 40, and the user interface 42 may operatively communicate with a software processing system that may include a trainable artificial intelligence (AI) system 50. The trainable AI system may comprise one or more of a neural network, a probabilistic technique such as Bayes or Markov algorithm, a kernel method (like SVM, decision trees/random forest, Gaussians, PCA . . . ), reinforcement learning that can have nothing to do with artificial neural networks, artificial reasoning a.k.a. "good old fashioned AI," many path-planning and intelligent control-systems methods that correspond to "classical AI" (not the same as GOFAI), Alife (swarms, cellular automata . . . ), agents and chaos systems, and/or any algorithm or group of algorithms that optimize a value function (reinforcement learning and linear dynamic programming).

The trainable AI system 50 is operable to interpret data from the sensors 32 and/or the controller 40 and to use the actuators 34 and/or controller 40 to make constant (as needed) adjustments in real time to provide increased comfort for a user 22 with or without user input. The user 22 can choose settings through the controller 40 and the trainable AI system 50 can readily respond to user movement, and in some cases provide predictive instructions to the piezoelectric adaptive mesh 26.

If the piezoelectric structures 30 are continuous (such as a long as the piezoelectric fiber 24), the piezoelectric adaptive mesh 26 may be constituted as an array of nodes. Regardless of whether the piezoelectric structures 30 are continuous or discrete, when a node acting as a sensor 32 is affected, such as by the weight of a user 22, then the software processing system can determine the location of the affected node by how long it takes the signal to reach the controller 40. If the piezoelectric structures 30 are individually wired, then the location of the affected sensor 32 is known by the wire run. The sensors 32 may also be wireless such as through the use of Zigbee™-type system that may be continuously or periodically broadcast.

In an example of a thicker piezoelectric fiber 24, such as the previously mentioned piezoelectric tape-wrapped wire, with a spacing about an inch apart, the threshold might be an inch of deflection to register voltage. The primary spike may last about a millisecond. If there is a bounce due to springs, then there may be smaller spikes following. When the node flattens back out another spike might be created. The software processing system may be configured to trigger on any spike event and be aware of spike direction to interpret, all while comparing to the spikes on all other nodes. There may be an ideal deformation mapping for a given user 22. So, when deformation varies, someone may be in pain, contracted, needing adjustment, involved in an activity, or holding a book to read. The patterns of the timing and sequence of node spikes can be assessed by the processing software to determine the situation and decide whether a preprogramed adjustment or AI extrapolated adjustment is warranted. The appropriate instructions can be conveyed from the software processing system to the controller which activates the specified actuators in the desired manner. Thicker piezoelectric fibers might be useful for some low-cost applications that cover large areas but some resolution may be sacrificed. One may appreciate that a denser piezoelectric adaptive mesh 26 employing medium of thinner piezoelectric fibers 24 with structural grid members 60 may offer greater resolution.

The piezoelectric adaptive mesh system 20 may be implemented for a seat, a bed, a sofa, or any other furniture upon which a user 22 can sit, lie, or recline. The piezoelectric adaptive mesh 26 may form a surface layer of these items or form a near surface layer, such as beneath a sheet, a foam layer, or other cushioning. Examples of a seat include office chairs, wheel chairs, car seats, or child seats. Examples of a bed include a residential bed, an RV bed, a hotel bed, a hospital bed, or a camping mattress. The piezoelectric adaptive mesh 26 may also be implemented as a furniture cover, such as a seat cover or a mattress cover.

The piezoelectric adaptive mesh system 20 may be utilized to adjust firmness of the piezoelectric mesh 26 that is supporting the user 22. The user 22 may utilize the user interface 42 to initially choose from a variety of advanced level user selection criteria, such as firmness and resilience, as well as several pre-programmed firmness settings based on conventional firmness standards or sleep numbers.

Users 22 may want to determine whether or not they want to have resonance or not, or position change or not, for perceived pain pressure points. The users 22 may interact with a map of what an algorithm thinks are pressure points and choose what to resonance, or change position for each. The user 22 may also specify their desired firmness anywhere on their contact map. They may "up arrow" and "down arrow" or specify a sleep number.

The sensors 32 may detect where the user 22 is positioned on the piezoelectric mesh 26. The software processing system with or without an AI system 50 may determine where various parts of the user's body are positioned and may use this information to determine whether the user 22 is a right-side sleeper, a left-side sleeper, a back sleeper, or a stomach sleeper. Moreover, the sensors 32 with the cooperation of the software processing system may determine the breathing pattern of the user 22 based on diaphragmatic movement of the chest.

The software processing system with the cooperation of the controller may activate the actuators 34 to adjust the firmness as initially selected by the user 22. The combination of sensors 22, actuators 34, controller 40, and the software processing system may maintain a constant firmness as set by the user 22 regardless of how the user 22 moves or positions his or her (or their) body. In particular, the adaptive piezoelectric mesh system 20 may be adapted to apply a specified amount of force to specific mesh locations in proportional response to weight of the various body parts.

Alternatively, the user 22 may select a sleep learning mode for firmness adjustment. The software processing system may access a database of sleep-related breathing data to determine the state of breathing of the user 22. The sensors 32 may constantly or continuously monitor the breathing state of the user 22, and the actuators 34 may constantly or continuously make adjustments to the firmness or other characteristics of the piezoelectric mesh 26 at specific locations as determined by the software processing system to alter the breathing state of the user 22 to bring the breathing state increasingly closer to a user breathing state that resembles a sleeping breathing state.

Possibly using the AI system 50, the software processing system of the piezoelectric adaptive mesh 20 may readily learn to vary the responses of the actuators 34 at specific body locations to induce sleep (or induce more restful sleep). In particular, the software processing system may learn a general optimum firmness and other characteristic settings for the beginning of the falling asleep process and adjust the actuators 34 accordingly. Moreover, the software processing system may learn specific firmness and other characteristic settings for specific areas of the body to facilitate the falling asleep process and for maintaining restful sleep by adjusting the actuators 34 accordingly. Although the user 22 may choose initial settings through the controller 40, the trainable AI system may readily respond to user movement, and even provide predictive instructions to the actuators 34 of the piezoelectric mesh 26. One will also appreciate that although many of these embodiments are described herein by way of examples to a bed surface and sleeping, similar techniques can be used to apply to seat surfaces and comfort.

The piezoelectric adaptive mesh system 20 may accommodate multiple users 22 on a sofa or in a bed. Based on learned experience, the piezoelectric adaptive mesh system 20 may recognize different individuals regardless of their positions on the piezoelectric mesh 26 and adjust the appropriate actuators 34 to suit the needs of the specific individuals. Additionally, the software processing system may direct the controller 40 to make adjustments based on sensor data regarding the combination of the individuals. For example, if two individuals are in close proximity, creating a gravitational well, the software processing system may direct the actuators 34 to raise the low spot.

The piezoelectric adaptive mesh system 20 may also address problems associated with a downside arm or other downside appendage. These problems may include arm pain to the user 22 or numbness or discomfort to a sleeping partner who may be lying on top of the arm. For example, the software processing system may instruct the actuators 34 surrounding the offending appendage to raise the piezoelectric mesh 26 around the appendage and/or instruct the actuators 34 beneath the offending appendage to lower the piezoelectric mesh 26 beneath the appendage, effectively creating a depression or trough for the appendage. Moreover, the constant feedback provided by the sensors 32 may be employed to move this depression as the appendage moves.

The piezoelectric adaptive mesh system 20 may be utilized to slowly rock a user 22 to sleep. The user 22 may utilize the user interface 42 to initially choose the side-to-side speed and/or force to be applied by the piezoelectric mesh 26. The user interface 42 may offer a variety of advanced level user selection criteria as well as several pre-programmed default rocking options. The sensors 32 can detect where the user 22 is positioned and start a wave-like motion over the appropriate area (in accordance with the sensor data) based on the user selection. Employing the breathing monitoring and analysis techniques previously described, the software processing system can adjust the nature of the rocking motion via the actuators 34 to induce sleep and, in particular, the software processing system can learn what rocking characteristics are most beneficial for relatively quickly inducing restful sleep. In some embodiments, the piezoelectric adaptive mesh system 20 may be employed to simulate movement of a waterbed.

Similarly, the piezoelectric adaptive mesh system 20 may be utilized to move a user 22 to avoid bedsores. Specifics of the movement, such as a slow rocking of a user 22 a few degrees to one side and then to the other side, may be improved by sensor-derived knowledge of the weight of the user 22 and the amount of time any one body area has not been moved, for example. Moreover, the learning capabilities of the software processing system can facilitate bedsore prevention for the specific individual.

The piezoelectric adaptive mesh system 20 may be employed to provide safety enhancements for elderly users 22, young children, or users 22 who are drunk to help with balance. In particular, a user 22 may select a safety mode on the user interface 42. In response, the software processing system can cause the actuators 34 to raise the edges of a bed or sofa and/or lower the center of a bed or sofa to lean the user toward the center of the piezoelectric mesh 26 as a default, so the user 22 doesn't fall out of bed or off the sofa. Conversely, a user 22 may select an ascend mode on the user interface 42. In response, the software processing system can cause the actuators 34 to lower the edges of a bed or sofa and/or raise the center of a bed or sofa to assist the user 22 to become upright and get out of the bed or sofa. Similarly, the software processing system can cause the actuators 34 to lower the edges of a wheelchair seat and/or raise the center of the wheelchair seat to assist the user 22 to become upright get out of the wheelchair.

The piezoelectric adaptive mesh system 20 may also be employed to detect whether a user 22 starts snoring or experiences apnea, and the software processing system may cause the actuators 34 to raise the user's head or take other action as a remedy. The piezoelectric adaptive mesh system 20 may detect snoring, apnea, and/or other sleep disorders in several ways. The software processing system may analyze changes in the diaphragmatic movement as sensed by the sensors 32. The software processing system may communicate with an auditory sensor, which may be incorporated into the piezoelectric fibers 24 or the electronics of the controller 40, user interface 42, or AI system or may be associated with a stand-alone device, such as a cell phone microphone. The software processing system in cooperation with the auditory sensor may be able to distinguish snoring or other sleep irregularities from the breathing sound of normal sleep. The software processing system may communicate with an oxygen sensor, such as a thumb clamp oxygen sensor. For example, a ten percent raise in head height can raise oxygen utilization from low 80's % to high 90's % at home to ameliorate apnea or in a hospital. One will appreciate that any combination of these techniques may be employed.

The piezoelectric adaptive mesh system 20 may provide an adjustable massage mode. The user 22 may select from a variety of default massage settings on the user interface 42. The user may also select specific areas of the body for particular attention. The software processing system can adjust states of pressure or states of vibration of the actuators 34.

The piezoelectric adaptive mesh system 20 may provide a physical therapy mode that can be used to provide deep heating to soft tissues. The piezoelectric actuators 34 can be directed by the software processing system and/or the controller 40 to vibrate at a desired ultrasonic frequency at specific locations. Some embodiments that are configured to provide a physical therapy mode may employ a padding 64 that utilizes an ultrasonic gel.

A piezoelectric adaptive mesh system 20 configured for ultrasonic functionality may be employed to provide frequency in the 20 kHz to 30 kHz to function as a cavitation machine to melt fat at specific locations. These frequencies can dissolve the walls around fat cells so that the fat is released into the body of a user 22 and metabolized. The software processing system can determine the appropriate body locations, such as machine-identified or user-selected, that are in contact with piezoelectric adaptive mesh 26 and apply the ultrasonic frequencies from the actuators 34 at the specific locations. The cavitation effects can be applied at any time, such as when a user is seated in a chair or sleeping on a bed.

Fat may also be "melted" by causing the fat molecules to rub against each other, which causes them to discharge their stored molecules. This type of fat melting may be accomplished by employing a resonating layer held in optimum contact with a user's body. In this embodiment, the resonating frequency may be ultrasonic of another frequency that maximizes the rubbing together effect.

Ultrasonic and other sounds may be produced by circular diaphragms of piezoelectric speakers. The sounds may be in the human audible range, ultrasonic, or in the radio-wave spectrum. Examples of how these sounds are produced from electrostatic or piezo-electric speakers are described in https://www.sciencedirect.com/science/article/abs/pii/S0003682X17302712, https://www.americanpiezo.com/standard-products/buzzers.html, and https://www.edn.com/piezoelectric-driver-finds-buzzers-resonant-frequency/.

The piezoelectric adaptive mesh system 20 may be configured to administer transcutaneous electrical nerve stimulation (TENS) to reduce pain and/or relax muscles. Such piezoelectric adaptive mesh systems 20 may employ specialized padding 64 that can accommodate placement of suction cups or sticky pads (TENS pads) like those used for an ECG, EMG, or EKG. The TENS wiring may be included inside each TENS pad, and these TENS pads may also be configured to include gel to provide better electrical conductivity. The software processing system may coordinate the TENS treatment with treatment by piezoelectric structures 30 configured for ultrasonic activity.

Guidelines for using TENS pads for a given stimulation may be found at https://omronhealthcare.com/2014/01/10-tips-for-tens-pad-placement/. The software processing system may assist with the determination of TENS pad placement for optimal pain relief with TENS. The user 22 may indicate exactly where the pain is located by outlining the most concise and tender area of the pain, such as on a body map provided by the user interface 42. The software processing system through the user interface 42 may identify (or help the user 22 identify) at least two locations where to connect the TENS pads on the padding 64 associated with the piezoelectric mesh 26.

Some criteria that the user 22 or the software processing system may consider: the TENS pads may be placed in different orientations, including vertical, horizontal, and angled; the TENS pads should be at least an 1 inch apart but as the distance between the two TENS pads increases the effectiveness decreases; placement of TENS pads directly over a joint should be avoided because the TENS pads can more easily come loose; the TENS pads may be placed in vertical orientations above and below long stretches of pain; the TENS pads may be placed in horizontal orientations above and below pain focused over a smaller area; the TENS pads may be placed in a vertical and a horizontal orientation on muscle or soft tissue above and below a painful joint; and when the pain is wide (e.g. between shoulders below the neck), the TENS pads may be placed to the left and right side of the spine in a vertical direction, and if the pain extends out even further above or below the shoulder area, the TENS pads can be angulated to encompass the region of discomfort. When more than two or more TENS pads are used, the user 22 or the software processing system may alter the flow of the electrical sensation by changing the distance between the TENS pads and/or the direction of flow between the TENS pads.

The piezoelectric adaptive mesh system 20 may be configured to accommodate magnetic functionality. Permanent magnets can be intermingled with piezoelectric structures 30, as long as the piezoelectric structures 30 are shielded or are far enough away. Electromagnets may alternatively or additionally be intermingled with piezoelectric structures 30, as long as the piezoelectric structures 30 are shielded or are far enough away. However, the piezoelectric structures 30 may be employed without shielding or distance if the electromagnets are controlled or pulsed so as not to interfere with sensing or actuation of the piezoelectric structures 30.

For example, the electromagnets may be used in turn with piezoelectric sensing and stimulation. In particular, during a first time window, the piezoelectric sensors 32 may be employed to sense body location and/or to detect a malady. During a second time window, the electromagnets or the piezoelectric actuators may be employed. During an optional time window, the other of the electromagnets or the piezoelectric actuators may be employed. During a subsequent first time window, the piezoelectric sensors 32 may search for resonant effects, resonance of organs, and/or interaction with other hardware, sensors 32, and/or actuators 34. During a subsequent second time window, the electromagnets or the piezoelectric actuators may be employed to enhance, suppress, and/or modulate resonances, amplitudes, frequencies, and/or phase delays. EMI/RFI shield material can be added to the areas that the user 22 would not want magnetized.

The piezoelectric adaptive mesh system 20 may also be employed to better accommodate more active interactions between users 22, helping them keep balanced and not tip over. For example, the piezoelectric adaptive mesh 26 may provide support to particular body parts based on movement, historical data, user preset preferences, and machine learning.

Moreover, the software processing system may cause the actuators 34 of the piezoelectric adaptive mesh 26 to simulate the movement of a waterbed and may automatically adjust the characteristics of the wave based on the activity of the users 22 to enhance the activity between the users 22.

The piezoelectric adaptive mesh system 20 may also operate without a power source. As previously discussed, piezoelectric structures 30 can convert human movement to electrical energy which can be employed to activate specific actuators 34. The piezoelectric adaptive mesh 20 may also be configured to exhibit pyroelectricity, which is the ability to generate a voltage and charge following a change in temperature. As previously discussed, the piezoelectric actuators 34 may be employed to generate heat. Conversely, the piezoelectric actuators may convert heat to electrical energy. So, the piezoelectric adaptive mesh 20 may capture human body heat and convert it to electrical energy which can be employed to activate specific actuators 34. This acquired electrical energy may be employed to perform any of the previously described functions of the piezoelectric adaptive mesh 20.

Similarly, the piezoelectric adaptive mesh 20 may function as a heating pad and even convert human movement to heat. Additionally, the piezoelectric adaptive mesh 20 may absorb heat from specific locations to cool them and to covert that heat to electricity that may be employed to heat other specific locations. For example, the piezoelectric adaptive mesh 20 may capture heat from a warmer person in one location and transfer it to a cooler person in another location.

Applications of the piezoelectric adaptive mesh system 20 are not limited to furniture applications or to use solely on humans. For example, the piezoelectric adaptive mesh system 20 may also be used as a blanket. It can provide heating and/or cooling as previously discussed. It can also provide ultrasonic and/or magnetic treatment as previously discussed. Magnetic blankets are already used for horses. These blankets may be enhanced by a piezoelectric adaptive mesh system 20. A piezoelectric mesh 26 may also be enhanced by an EMF layer to protect a user 22, such as a patient from WiFi signals in vulnerable body areas (brain, reproductive area).

Moreover, the piezoelectric adaptive mesh 26 does not have to lie in a flat plane, nor does it have to be horizontal. The piezoelectric adaptive mesh 26 may be configured and employed as an article of clothing, ranging from as small as a sock, belt, arm cuff, glove, neck wrap, head cover, or legging to a pair of shorts or a shirt, or to an entire body suit. For example, with a piezoelectric adaptive mesh 26 configured as a target garment, the fat "melting" embodiments may be more precisely applied.

The piezoelectric adaptive mesh 26 or its padding 64 may interact in direct contact with the user 22 or at a distance. In some embodiments, a series of two or more layers of piezoelectric bending actuators 34 may be employed to achieve complex curves. Moreover, one layer may be employed to hold a shape (and optionally act as a sensor layer) while another layer may act to resonate. These complex curves may be used by the control algorithm to pinpoint site areas to gently modify actuator pressure or configuration and/or resonate at specific locations. As discussed previously, each piezoelectric actuator 34 may, depending on size, typically deform as much as an inch. The deflected shape of the total piezoelectric adaptive mesh 26 may therefore be more than adequate to fits the shapes of humans and other larger animals. The user 22 of the piezoelectric adaptive mesh 26 may be a human, an animal, or any other living organism that may be stimulated via piezoelectric activation.

In one embodiment, with stimulation under control of the software processing system, a user 22 with unsteady walking and/or fear of falling may be provided with sufficient compensatory stimulation by a piezoelectric adaptive mesh 26 to provide the confidence to walk. Similarly, users 22 who have been bedridden and are just walking again may employ this type of embodiment to stimulate muscles for a faster recovery. This piezoelectric adaptive mesh 26 may be used in concert with leg braces until sufficient strength is achieved to remove the braces.

In another embodiment, the piezoelectric adaptive mesh 26 in the form of a wearable item may act as a result of direct commands by the user 22, by movements of the user, in concert with a control algorithm, via interaction with a furniture-based piezoelectric adaptive mesh 26, via interaction with a virtual reality simulation, and/or via interaction with another user 22 with a similar interface. Heat, odor, sound, motion, or other indicators may be sensed, and in turn stimulated at a distance and/or in contact. An example of a medical system that can interact with the piezoelectric adaptive mesh 26 such as a wearable or furniture pad can be found in U.S. patent application Ser. No. 16/836,704, filed Mar. 31, 2020 for Portable Scanning Device and Processing System, which is hereby incorporated by reference herein. In particular, the piezoelectric adaptive mesh 26 may perform many of the sensing functions and/or treatment functions of the portable scanning device, or the piezoelectric adaptive mesh 26 may perform many of the treatment functions that may be indicated by the portable scanning device.

In another embodiment, a garment of piezoelectric adaptive mesh 26 may be provided to a user 22 with Parkinson's disease. Perhaps the user's hands shake at between 8.5 and 9 Hz in the morning, but they shake faster later in the day and even more so in the evening. A piezoelectric adaptive mesh 26 in the form of a glove, perhaps with a gel layer may be used to sense the frequency of the vibrations in real time. In one example, the glove may be a fingerless glove with the sensors and actuators of the piezoelectric mesh 26 positioned on the back-of-the-hand side of the glove.

The piezoelectric actuators 34 may be employed to provide cancelation vibrations (180 degrees out of phase) and/or provide ultrasonic vibrations to relax the nerves and muscles, which might also stop the shaking. In another example, the shaking may originate higher up the arm such as in the upper arm, so an armband or cuff of piezoelectric mesh may be employed. The sensors 32 and the actuators 34 may be weaved together, or one half of the circle of the armband may include the sensors 32 and the other half of the circle may include the actuators 34. Alternatively, one half of the width of the armband may include the sensors 32 and the other half of the width may include the actuators 34. In an additional example, an armband with piezoelectric mesh 26 and a glove with piezoelectric mesh 26 may cooperate to work together, with one of them having the sensors 32 and the other having the actuators 34.

In an alternative to piezoelectric actuators 34, the gloves may be configured to work with linear resonant drives in the form of voice coils, such as used in smart watches. Unfortunately, such voice coils currently have fixed frequencies, the lowest being 175 Hz. However, they may be modified to have a variable output based around the 8.5 to 9 Hz.

Depending on the magnitude of stimulation needed, some piezoelectric actuators 34 may be sealed to withstand perspiration and washing, while others may benefit from a hole on the side facing away from the user 22 in order to allow a proper stimulation magnitude to be achieved. If the piezoelectric structures 30 are configured to be removed from the piezoelectric adaptive mesh 26, such as a garment, before it is washed, the achieved. If the piezoelectric structures 30 are configured to be removed from the piezoelectric adaptive mesh 26 may have reinforced holes or slits throughout, such as in a grid. In some embodiments, the piezoelectric actuators 34 may be press fit inserted, screwed into, snapped into, or molded into piezoelectrically-active suction cups or pads that may then be fit back through these holes or slits after the piezoelectric adaptive mesh 26 has been washed. The piezoelectrically-active suction cups or pads may be loose or all tied together in linear strings and/or form a grid-like net. These piezoelectrically-active suction cups or pads may optionally be filled with the same gel that the piezoelectric adaptive mesh 26 may optionally be filled with to optimize the transfer of ultrasonic stimulation. In other embodiments, there may be a waterproof barrier between the electronics and the user 22, so the electronics don't have to be washed. If all electronics are placed inside of the gel pad, and the gel pad in inside of a clothing sleeve, the clothing sleeve may be washed.

In a private setting, the piezoelectrically-active suction cups and netting may be worn directly on the user's skin without the padding 64, or the piezoelectrically-active suction cups and netting may be covered loosely by a lightweight or thin-fabric garment, such as a muumuu. This embodiment may be useful for very hot and humid conditions or for applications that involve personal entertainment. The piezoelectrically-active suction cups may be easy to clean with a baby wipe or disinfectant cloth.

The piezoelectrically-active suction cups do not need to actually achieve suction in order to work, especially if contacting a clothed user 22, or a user 22 with hair or fur, but gentle adhesion capabilities may enhance performance. The user interface 42 may provide the user 22 with information of this type so the user 22 may choose to spritz the piezoelectrically-active suction cups with water (or similar fluid) and then apply the piezoelectrically-active suction cups to their skin.

Determination of the level of stimulation may vary. Deflection of a piezoelectric bending element may be independent of frequency and proportional to the operating voltage. As resonant frequency is approached, deflection may rise rapidly to a multiple of its non-resonant value. Once a resonant mode is exceeded, deflection decreases steadily with the square of the frequency. Extended application of a resonant mode may degrade the piezoelectric structure 30 if applied continuously, so pulsed application to attain an overall resonance across the piezoelectric adaptive mesh 26 may extend its life. The software processing system may employ pulsed operation instead of continuous operation based on predictive assessments.

In particular, some piezoelectric actuators 34 may act more strongly and durably in compression than tension, such as those that are piezoceramic, so the software processing system may utilize knowledge of the particular types of the piezoelectric structures 30 to address longer time intervals of activation to avoid damage and degraded performance.

Moreover, if the piezoelectric adaptive mesh 26 is acting as a form fit for comfort and holding its position, its piezoelectric actuators may be controlled to act below their fundamental resonance. The actuator 34 may then be treated as a capacitive load, and its control circuit may supply charge to cause a motion, then withdraw charge to cause a retraction, because charge applied to the actuator 34 does not bleed off internally. While holding a position, each piezoelectric actuator 34 will typically draw much less than a microamp.

If the piezoelectric adaptive mesh 26 is acting as a form fit for comfort holding its position, such a piezoelectric actuator 34 may be readily powered by solar cells or hand crank powered, as changes in form may only be made periodically, as the user 22 changes their position, or due to the possibility of bed sores, changes to fit are controlled based on a schedule.

The capacitive load of each piezoelectric actuator 34 may be generally equal to its transducer capacitance with a (typically 10-100 ohm) resistor in parallel. In order to avoid damage to the piezoelectric actuator 34 from sudden voltage and amperage spikes or dips, a protection resistor may to be placed in series with the actuator 34.

Piezoelectric materials vary with temperature, so a temperature measurement, typically with a thermocouple may facilitate proper modelling and control. Also, the electrodes of each piezoelectric actuator 34 may benefit from periodic short circuiting to cool down to avoid generating an excessive electric field. The more that piezoelectric actuators 34 are stimulated, the more heat they produce, so they can be used to soothe sore muscles where applied.

Piezoelectric operation may be adapted to interact with the user 22 at a frequency that the user prefers, as determined directly by user input, or indirectly via sensor observation of user movements that indicate irritation, relaxation, or pleasure. Users 22 may be irritated, relaxed, and/or pleasured by the piezoelectric actuators 34 via touch, temperature, or sound. Once a given the threshold is determined by the control software, a threshold can be set to avoid crossing it again. Users 22 may vary substantially in their hearing and vibration resonance thresholds. If the user 22 moves sufficiently, and all other energy needs are met, excess piezoelectric generated voltage may be directed to charge the user's electronic devices such as their cell phone.

CONCLUSION

The terms and descriptions used above are set forth by way of illustration and example only and are not meant as limitations. Those skilled in the art will recognize that many variations, enhancements and modifications of the concepts described herein are possible without departing from the underlying principles of the invention. For example, skilled persons will appreciate that the subject matter of any sentence or paragraph can be combined with subject matter of some or all of the other sentences or paragraphs, except where such combinations are mutually exclusive. The scope of the invention should therefore be determined only by the following claims, claims presented in a continuation patent application, and equivalents to the foregoing claims.

The invention claimed is:

1. An adaptive piezoelectric mesh system, comprising:
multiple piezoelectric fibers configured as a piezoelectric mesh, including first multiple piezoelectric fibers and second multiple piezoelectric fibers, wherein each of the first multiple piezoelectric fibers have multiple discrete first piezoelectric structures that are spaced apart along a length of a first wire, wherein the first piezoelectric structures are operable to function as first sensors, wherein the first sensors are operable to determine received force applied to the piezoelectric mesh, wherein each of the second multiple piezoelectric fibers have multiple discrete second piezoelectric structures that are spaced apart along a length of a second wire, and wherein the second piezoelectric structures are operable to function as second actuators, wherein the second actuators are operable to apply exerted force from the piezoelectric mesh; and
a controller responsive to a software processing system that is operable to directly or indirectly receive sensor input from the first piezoelectric structures and operable to cause the controller to direct power to one or more of the second piezoelectric structures in response to the sensor input, wherein the software processing system is operable to determine locations of the first sensors based on first sensor signals from respective first sensors in response to received force applied to the respective first sensors and assess a received movement pattern based on a timing sequence of the first sensor signals, and wherein the software operating system is operable to formulate an exerted movement pattern for the second actuators and direct the controller to apply second actuator signals to respective second actuators to make the piezoelectric mesh perform the exerted movement pattern.

2. The adaptive piezoelectric mesh system of claim 1, wherein the software processing system includes, or is configured to be in communication with, a trainable artificial intelligence (AI) system.

3. The adaptive piezoelectric mesh system of claim 1, wherein one or more of the first piezoelectric structures are operable to function as first actuators and/or wherein one or more of the second piezoelectric structures are operable to act as first sensors.

4. The adaptive piezoelectric mesh system of claim 1, wherein the first piezoelectric fibers and/or the second piezoelectric fibers include piezoelectric structures that are configured to function as both sensors and actuators.

5. The adaptive piezoelectric mesh system of claim 1, wherein the first piezoelectric fibers and the second piezoelectric fibers have different compositions.

6. The adaptive piezoelectric mesh system of claim 1, wherein the adaptive piezoelectric mesh system is operable to determine where various parts of a body of a user supported by the piezoelectric mesh are interacting with the multiple piezoelectric fibers, and wherein this information is used to determine whether the user is a right-side sleeper, a left-side sleeper, a back sleeper, or a stomach sleeper.

7. The adaptive piezoelectric mesh system of claim 1, wherein the controller is operable to cause application of a specified amount of force to specific mesh locations in response to weight of a body.

8. The adaptive piezoelectric mesh system of claim 1, wherein the adaptive piezoelectric mesh is configured for furniture, wherein the furniture is a chair, a bed, an office chair, a car seat, a child seat, a residential bed, a hotel bed, a hospital bed, a mattress, a sofa, a couch, a loveseat, a cushion, a camping mattress, an RV mattress, a mattress cover, a seat cover, or a sofa cover.

9. The adaptive piezoelectric mesh system of claim 1, wherein the controller or the software processing system operatively communicates with a user interface through a wireless connection.

10. The adaptive piezoelectric mesh system of claim 1, wherein the controller is configured to make real-time adjustments to the actuators in the piezoelectric mesh to increase comfort of a user.

11. The adaptive piezoelectric mesh system of claim 1, wherein the exerted movement pattern is configured as a timing sequence of second actuator signals to respective second actuators to upwardly and downwardly deflect the piezoelectric mesh at appropriate locations to create a wave-like motion over an appropriate area to slowly rock a user.

12. The adaptive piezoelectric mesh system of claim 1, wherein the controller is operable to cause the piezoelectric mesh to provide a massage to a user.

13. The adaptive piezoelectric mesh system of claim 1, wherein the exerted movement pattern is configured as second actuator signals to respective second actuators to upwardly deflect the piezoelectric mesh at appropriate locations to raise a user's head in response to measurements made by an oxygen sensor.

14. The adaptive piezoelectric mesh system of claim 1, wherein the exerted movement pattern is configured as second actuator signals to respective second actuators to upwardly deflect the piezoelectric mesh at appropriate locations to raise a low spot.

15. The adaptive piezoelectric mesh system of claim 1, wherein a user interface associated with the piezoelectric mesh provides pre-programmed fitness setting based on conventional firmness standards, wherein the fitness settings include a first firmness setting and a second firmness setting, wherein the received movement pattern defines a first contour for a first person at a first contour location and a second contour for a second person at a second contour location, wherein the exerted movement pattern is configured as second actuator signals to respective second actuators to cause the piezoelectric mesh at appropriate first and second contour locations determined by the first contour and the second contour to simultaneously provide a first firmness and contour combination for a first person and a second firmness and contour combination for a second person based on respective selections of the first firmness setting and the second firmness setting, wherein the first and second combinations are different.

16. The adaptive piezoelectric mesh system of claim 1, wherein the controller is operable to cause the piezoelectric mesh to provide heat.

17. The adaptive piezoelectric mesh system of claim 1, wherein the piezoelectric adaptive mesh comprises multiple layers of piezo electric mesh.

18. The adaptive piezoelectric mesh system of claim 1, further comprising optical fibers, wherein the optical fibers are configured to propagate a light of a known wavelength and temperature, wherein an optical fiber-sensor is configured to determine changes in temperature or wavelength, and wherein data from the optical fiber-sensor is fused with data obtained from the first sensors to provide an enhanced map of a position of a person supported by the piezoelectric mesh.

19. A reactive piece of furniture, comprising:
an adaptive piezoelectric mesh system having multiple piezoelectric fibers configured as a piezoelectric mesh, including first multiple piezoelectric fibers and second multiple piezoelectric fibers, wherein each of the first multiple piezoelectric fibers have multiple discrete first piezoelectric structures that are spaced apart along a length of a first wire, wherein the first piezoelectric structures are operable to function as first sensors, wherein the first sensors are operable to determine received force applied to the piezoelectric mesh, wherein each of the second multiple piezoelectric fibers have multiple discrete second piezoelectric structures that are spaced apart along a length of a second wire, and wherein the second piezoelectric structures are operable to function as second actuators, wherein the second actuators are operable to apply exerted force from the piezoelectric mesh; and
a controller responsive to a software processing system that is operable to directly or indirectly receive sensor input from the first piezoelectric structures and operable to cause the controller to direct power to one or more of the second piezoelectric structures in response to the sensor input, wherein the software processing system is operable to determine locations of the first sensors based on first sensor signals from respective first sensors in response to received force applied to the respective first sensors and assess a received movement pattern based on a timing sequence of the first sensor signals, and wherein the software operating system is operable to formulate an exerted movement pattern for the second actuators and direct the controller to apply second actuator signals to respective second actuators to make the piezoelectric mesh perform the exerted movement pattern.

20. The adaptive piezoelectric mesh system of claim 1, wherein the received movement pattern is indicative of changes in diaphragmatic movement, and wherein the exerted movement pattern is configured as second actuator signals to respective second actuators to upwardly deflect the piezoelectric mesh to raise a user's head in response to changes in diaphragmatic movement.

21. The adaptive piezoelectric mesh system of claim 1, wherein an auditory sensor is associated with the piezoelectric mesh and configured to detect snoring, and wherein the exerted movement pattern is configured as second actuator signals to respective second actuators to upwardly deflect the piezoelectric mesh to raise a user's head in response to snoring detected by the auditory sensor.

22. The adaptive piezoelectric mesh system of claim 1, further comprising optical fibers, wherein the optical fibers are configured for propagation of a sequence of varying wavelengths of light, wherein an optical fiber-sensor is configured to determine changes in the propagated wavelengths, and wherein data from the optical fiber-sensor is compared with earlier data obtained from the optical fiber sensor to recalibrate the adaptive piezoelectric mesh system to account for aging and/or stretching inelastically.

23. The adaptive piezoelectric mesh system of claim 1, further comprising an ultrasonic gel padding positioned between the first sensors and first actuators, wherein the piezoelectric mesh is configured for placing the first sensors closer to a user and the first actuators farther from the user, and wherein the first actuators are configured to vibrate at an ultrasonic frequency at specific locations.

24. The adaptive piezoelectric mesh system of claim 1, wherein the piezoelectric mesh is configured to administer transcutaneous electrical nerve stimulation (TENS) via TENS pads attached to piezoelectric mesh padding, and wherein the software processing system is configured to coordinate TENS treatment with treatment by the first sensors that are configured to vibrate at an ultrasonic frequency.

25. The adaptive piezoelectric mesh system of claim 1, wherein the multiple piezoelectric fibers include one or more third multiple piezoelectric fibers having one or more third piezoelectric structures, wherein one or more of the third piezoelectric structures are operable to function as third actuators and/or third sensors.

26. The adaptive piezoelectric mesh system of claim 1, wherein the adaptive piezoelectric mesh is configured for animal use.

* * * * *